US012727306B2

(12) United States Patent
Basin et al.

(10) Patent No.: US 12,727,306 B2
(45) Date of Patent: Sep. 1, 2026

(54) SEMICONDUCTOR STRUCTURE AND METHODS OF MANUFACTURING THE SAME

(71) Applicant: LUMILEDS LLC, San Jose, CA (US)

(72) Inventors: Grigoriy Basin, San Francisco, CA (US); Chee Ming Thoe, Jelutong (MY); Chee Teong Lim, Bayan Lepas (MY); Chee Jong Loh, Simpang Ampat (MY)

(73) Assignee: LUMILEDS SINGAPORE PTE. LTD., Singapore (SG)

( * ) Notice: Subject to any disclaimer, the term of this patent is extended or adjusted under 35 U.S.C. 154(b) by 443 days.

(21) Appl. No.: 18/127,974

(22) Filed: Mar. 29, 2023

(65) Prior Publication Data

US 2023/0317905 A1 Oct. 5, 2023

Related U.S. Application Data

(60) Provisional application No. 63/325,446, filed on Mar. 30, 2022.

(51) Int. Cl.
*H10H 20/857* (2025.01)
*H10H 20/01* (2025.01)
(Continued)

(52) U.S. Cl.
CPC ........ *H10H 20/857* (2025.01); *H10H 20/851* (2025.01); *H10H 20/0361* (2025.01);
(Continued)

(58) Field of Classification Search
CPC ..................... H01L 24/17; H01L 24/18; H01L 2224/16145; H10H 20/857; H10H 20/851; H10H 20/0362; H10H 20/0364
See application file for complete search history.

(56) References Cited

U.S. PATENT DOCUMENTS 8,557,629 B1 * 10/2013 Kim ..................... H01L 25/105 438/106
9,761,510 B2 9/2017 Liu
(Continued)

FOREIGN PATENT DOCUMENTS

CN 105097744 A 11/2015
CN 212303700 U 1/2021
(Continued)

OTHER PUBLICATIONS

From the Korean Intellectual Property Office as the ISA, Notification of Transmittal of the International Search Report and the Written Opinion of the International Searching Authority, or the Declaration, PCT/US2023/016710, Jul. 13, 2023, 11 pages.
(Continued)

*Primary Examiner* — Monica D Harrison
*Assistant Examiner* — Jacob T Nelson

(57) ABSTRACT

A semiconductor device is electrically connected to a power source through an electrical contact and at least one bump disposed on the electrical contact. The semiconductor device may be an LED on a CMOS wafer with the electrical contact spaced apart from it and disposed on the wafer. The semiconductor device and the electrical contact have side coating material disposed to surround them, and the at least one bump may be stacked to reach or nearly reach the top surface of the side coating material. The at least one bump may have its top surface exposed by the side coating material.

20 Claims, 14 Drawing Sheets

(51) Int. Cl.
*H10H 20/851* (2025.01)
*H10W 90/00* (2026.01)

(52) U.S. Cl.
CPC ..... *H10H 20/0362* (2025.01); *H10H 20/0364* (2025.01); *H10W 90/722* (2026.01)

(56) References Cited

U.S. PATENT DOCUMENTS 9,847,324 B2 12/2017 Lin et al.
9,997,561 B2 6/2018 Cha et al.
10,847,548 B2 11/2020 Bang
11,569,136 B2 1/2023 Lin et al.
2005/0023550 A1* 2/2005 Eliashevich ......... H10H 20/018 438/22
2008/0173884 A1 7/2008 Chitnis et al.
2015/0041845 A1 2/2015 Schwarz et al.
2016/0293811 A1* 10/2016 Hussell ................ H10H 20/857
2018/0240775 A1* 8/2018 Tsudome ................ H10F 77/93
2019/0123033 A1 4/2019 Martin
2020/0343230 A1 10/2020 Sizov et al.
2021/0151648 A1* 5/2021 Hin .................... H01L 21/4853

FOREIGN PATENT DOCUMENTS

KR 20190053347 A 5/2019
TW 201243970 A 11/2012
TW 201411749 A 3/2014

OTHER PUBLICATIONS

Extended European search report, EP23781743.2, Feb. 20, 2026, 9 pages.

* cited by examiner

SEMICONDUCTOR STRUCTURE AND METHODS OF MANUFACTURING THE SAME

CROSS REFERENCE TO RELATED APPLICATIONS

This application claims benefit of priority to U.S. provisional application No. 63/325,446 filed on Mar. 30, 2022, which is incorporated by reference in this application in its entirety.

FIELD OF THE INVENTION

The disclosure relates generally to LEDs, pcLEDs, LED and pcLED arrays, light sources comprising LEDs, pcLEDs, LED arrays, or pcLED arrays, and displays comprising LED or pcLED arrays. Particularly, this disclosure relates to methods and devices of connecting a semiconductor light emitting structure to a power source.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer. Phosphor-converted LEDs may be designed so that all the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED. Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

Technological and business applications of LEDs and pcLEDs include use in displays, matrices and light engines including automotive adaptive headlights, augmented-reality (AR) displays, virtual-reality (VR) displays, mixed-reality (MR) displays, smart glasses and displays for mobile phones, smart watches, monitors and TVs, and flash illumination for cameras in mobile phones. For example, backlights for liquid crystal-displays typically employ pcLEDs comprising a combination of green and red phosphors. The individual LEDs or pcLEDs in these architectures can have an area of a few square millimeters down to a few square micrometers (microLEDs).

The packaging of a thin film flip chip (TFFC) die on a complementary metal-oxide-semiconductor (CMOS) wafer, for use for example in devices as described above, requires the CMOS to be connected to a power source. Such a TFFC die may comprise multiple light emitting segments optionally each with a corresponding light converting element attached to its top light emitting surface, with gaps between adjacent segments and between the light converting elements attached to those segments. Conventionally, the whole structure is filled with a reflective side coat, for example scattering particles dispersed in silicone, by a molding process to fill the gaps. This side coating prevents use of a wire bonding process by which the CMOS might otherwise advantageously be connected to the power source.

SUMMARY

This specification discloses methods and devices with increased accessibility of electrical connectivity for wire bonding. Embodiments of the invention employ an electrically conductive bump or bumps stacked on electrical contacts that reach or nearly reach the top surface of side coating material around a die, allowing easy wire bonding of the die through those bumps without having to drill or otherwise break through the side coating material to access the electrical contact.

The methods and devices disclosed herein may be used for example in the various devices and applications listed above in the Background section.

These and other embodiments, features and advantages of the present invention will become more apparent to those skilled in the art when taken with reference to the following more detailed description of the invention in conjunction with the accompanying drawings that are first briefly described.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention.

Figure 1:
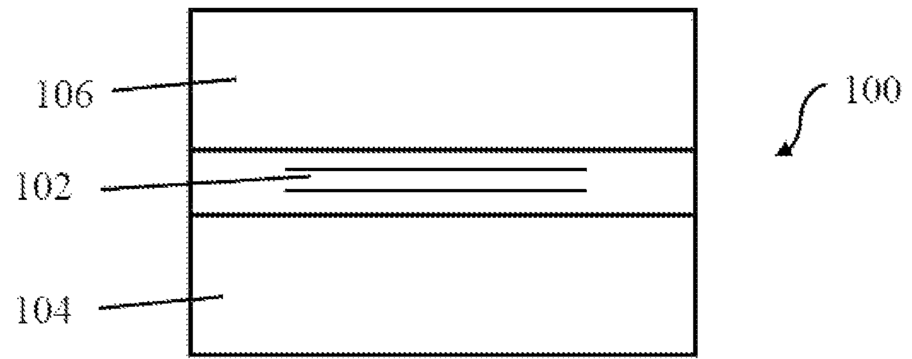
FIG. 1 shows a schematic cross-sectional view of an example pcLED.

FIG. 1 shows an example of an individual pcLED 100 comprising a light emitting semiconductor diode (LED) structure 102 disposed on a substrate 104, and a phosphor layer 106 (also referred to herein as a wavelength converting structure) disposed on the LED. Light emitting semiconductor diode structure 102 typically comprises an active region disposed between n-type and p-type layers. Application of a suitable forward bias across the diode structure results in emission of light from the active region. The wavelength of the emitted light is determined by the composition and structure of the active region.

The LED may be, for example, a III-Nitride LED that emits ultraviolet, blue, green, or red light. LEDs formed from any other suitable material system and that emit any other suitable wavelength of light may also be used. Other suitable material systems may include, for example, III-Phosphide materials, III-Arsenide materials, and II-VI materials.

Any suitable phosphor materials may be used, depending on the desired optical output and color specifications for the pcLED. Phosphor layers may for example comprise phosphor particles dispersed in or bound to each other with a binder material, or be or comprise a sintered ceramic phosphor plate.

Figure 2A:
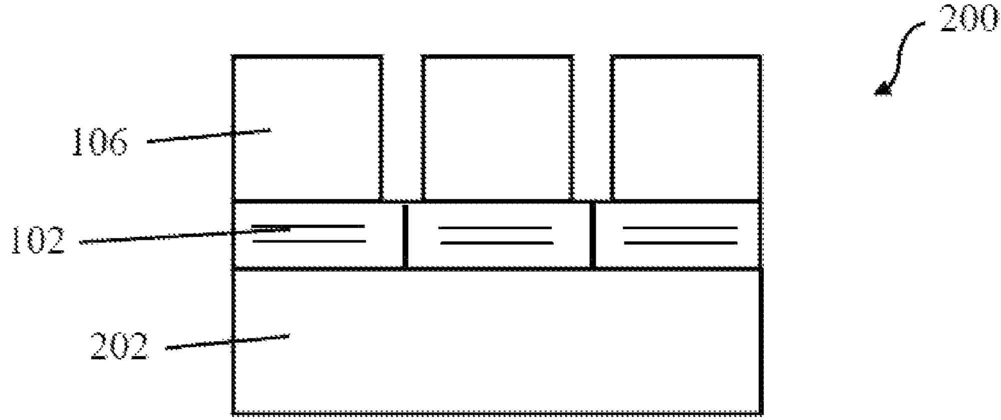
FIGS. 2A and 2B show, respectively, cross-sectional and top schematic views of an array of pcLEDs.
Figure 2B:
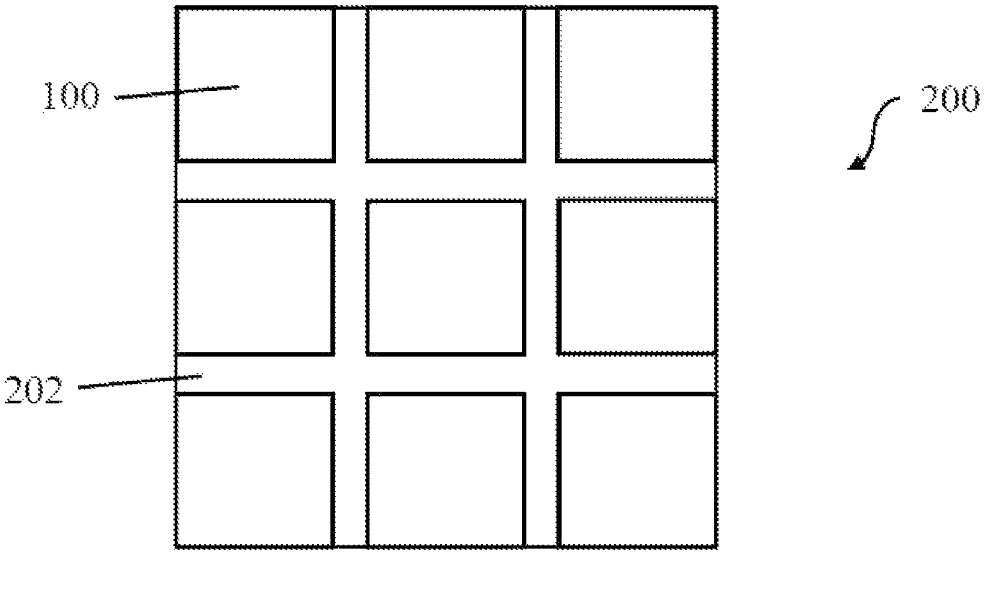

FIGS. 2A-2B show, respectively, cross-sectional and top views of an array 200 of pcLEDs 100 including phosphor layers 106 disposed on a substrate 202. Such an array may include any suitable number of pcLEDs arranged in any suitable manner. In the illustrated example the array is depicted as formed monolithically on a shared substrate, but alternatively an array of pcLEDs may be formed from individual mechanically separate pcLEDs arranged on a substrate. Substrate 202 may optionally comprise CMOS circuitry for driving the LED and may be formed from any suitable materials.

Although FIGS. 2A-2B show a three-by-three array of nine pcLEDs, such arrays may include for example tens, hundreds, or thousands of LEDs. Individual LEDs may have widths (e.g., side lengths) in the plane of the array of, for example, less than or equal to 1 millimeter (mm), less than or equal to 500 microns, less than or equal to 100 microns, or less than or equal to 50 microns. LEDs in such an array may be spaced apart from each other by streets or lanes having a width in the plane of the array of, for example, hundreds of microns, less than or equal to 100 microns, less than or equal to 50 microns, less than or equal to 10 microns, or less than or equal to 5 microns.

LEDs having dimensions in the plane of the array (e.g., side lengths) of less than or equal to about 50 microns are typically referred to as microLEDs, and an array of such microLEDs may be referred to as a microLED array.

Although the illustrated examples show rectangular LEDs or pcLEDs arranged in a symmetric matrix, the LEDs or pcLEDs and the array may have any suitable shape or arrangement and need not all be of the same shape or size. For example, LEDs or pcLEDs located in central portions of an array may be larger than those located in peripheral portions of the array. Alternatively, LEDs or pcLEDs located in central portions of an array may be smaller than those located in peripheral portions of the array.

In an array of pcLEDs, all pcLEDs may be configured to emit essentially the same spectrum of light. Alternatively, a pcLED array may be a multicolor array in which different pcLEDs in the array may be configured to emit different spectrums (colors) of light by employing different phosphor compositions. Similarly, in an array of direct emitting LEDs (i.e., not wavelength converted by phosphors) all LEDs in the array may be configured to emit essentially the same spectrum of light, or the array may be a multicolor array comprising LEDs configured to emit different colors of light.

The individual LEDs or pcLEDs in an array may be individually operable (addressable) and/or may be operable as part of a group or subset of (e.g., adjacent) LEDs or pcLEDs in the array.

An array of LEDs or pcLEDs, or portions of such an array, may be formed as a segmented monolithic structure in which individual LEDs or pcLEDs are electrically isolated from each other by trenches and/or insulating material, but the electrically isolated segments remain physically connected to each other by portions of the semiconductor structure.

An LED or pcLED array may therefore be or comprise a monolithic multicolor matrix of individually operable LED or pcLED light emitters. The LEDs or pcLEDs in the monolithic array may for example be microLEDs as described above.

A single individually operable LED or pcLED or a group of adjacent such LEDs or pcLEDs may correspond to a single pixel (picture element) in a display. For example, a group of three individually operable adjacent LEDs or pcLEDs comprising a red emitter, a blue emitter, and a green emitter may correspond to a single color-tunable pixel in a display.

Figure 3A:
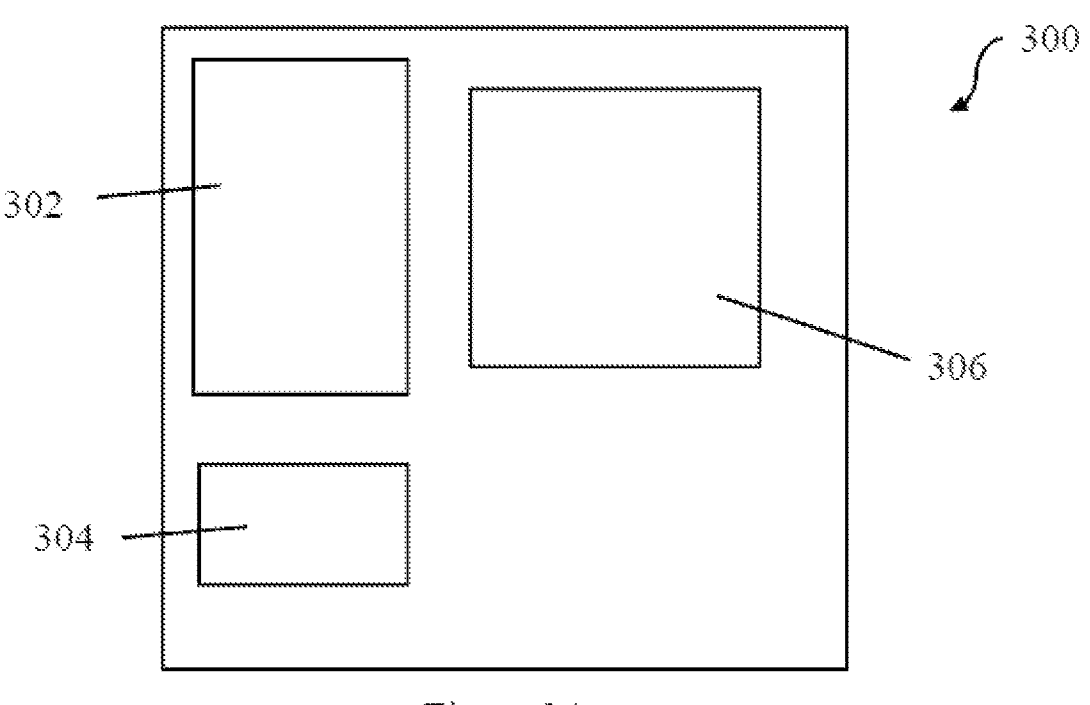
FIG. 3A shows a schematic top view of an electronics board on which an array of pcLEDs may be mounted, and FIG. 3B similarly shows an array of pcLEDs mounted on the electronic board of FIG. 3A.
Figure 3B:
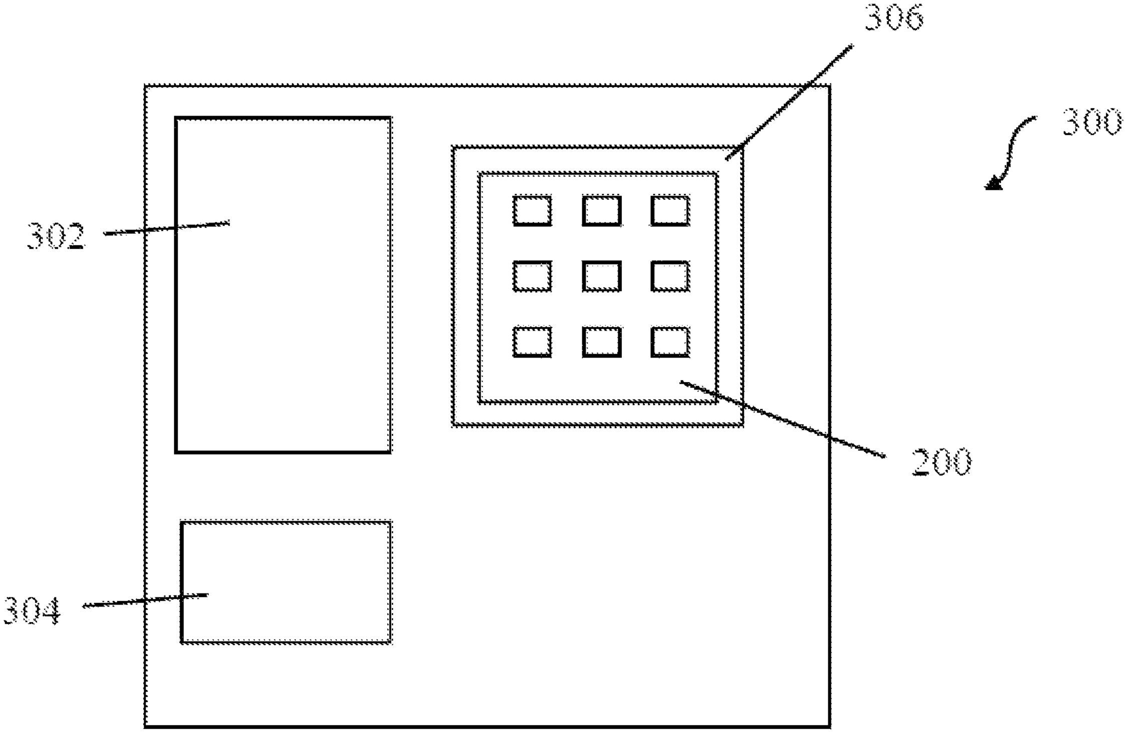

As shown in FIGS. 3A-3B, an LED or pcLED array 200 may be mounted on an electronics board 300 comprising a power and control module 302, a sensor module 304, and an attach region 306. Power and control module 302 may receive power and control signals from external sources and signals from sensor module 304, based on which power and control module 302 controls operation of the LEDs/pcLEDs. Sensor module 304 may receive signals from any suitable sensors, for example from temperature or light sensors.

Alternatively, array 200 may be mounted on a separate board (not shown) from the power and control module and the sensor module.

Individual LEDs or pcLEDs may optionally incorporate or be arranged in combination with a lens or other optical element located adjacent to or disposed on the phosphor layer. Such assemblies may be called light engines or luminaires. A light engine is an integrated assembly having one or more LEDs (such as an LED array) as well as a driver and/or other circuitry capable of driving the LEDs. For example, a light engine may be a circuit board with a mounted LED chip. A luminaire is a device including an LED and/or a light engine, which may further include components to shape or otherwise distribute the light from the LED as well as components relating to other considerations such as aesthetics of the device. For example, a luminaire may include an LED and a reflector or a len to collimate the light from the LED. There may be more than one reflector or lens in a luminaire, the combination of which provides light of the desired shape and/or color.

Figure 4A:
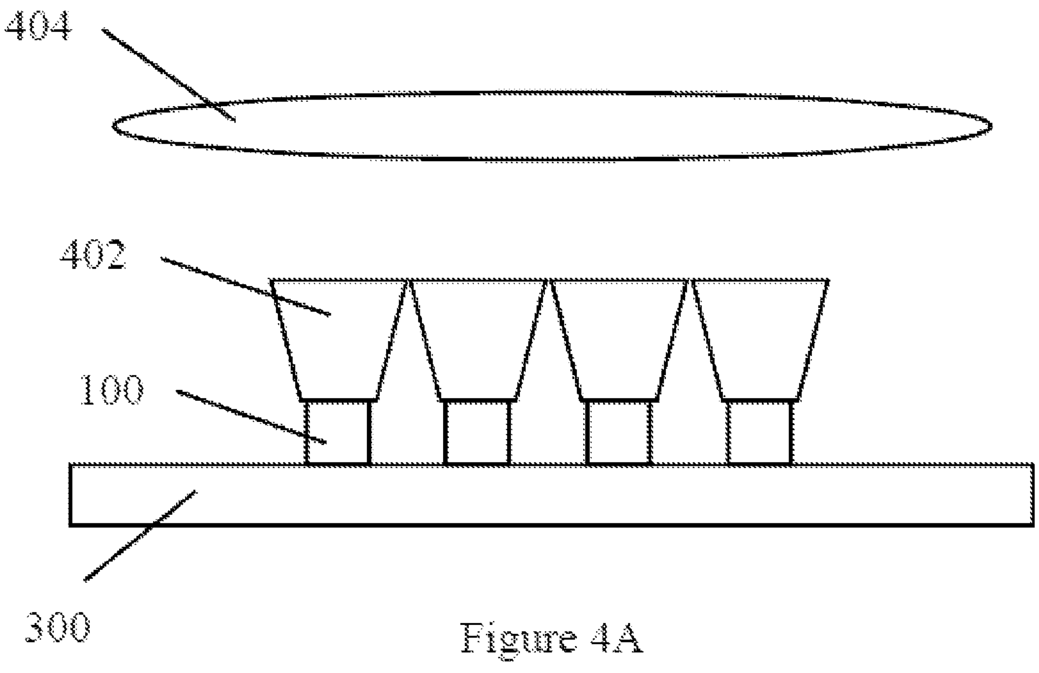
FIG. 4A shows a schematic cross-sectional view of an array of pcLEDs arranged with respect to waveguides and a projection lens.
Figure 4B:
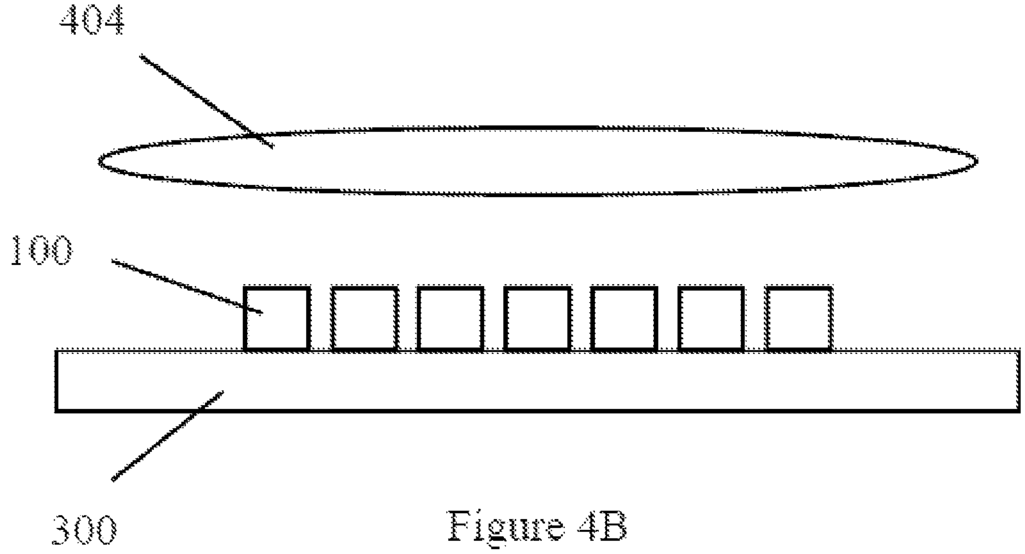
FIG. 4B shows an arrangement similar to that of FIG. 4A, without the waveguides.

The optical element referred to above, not shown in the figures, may be referred to as a "primary optical element". In addition, as shown in FIGS. 4A-4B an array 200 (for example, mounted on an electronics board 300) may be arranged in combination with secondary optical elements such as waveguides, lenses, or both for use in an intended application. In FIG. 4A, light emitted by pcLEDs 100 is collected by waveguides 402 and directed to projection lens 404. Projection lens 404 may be a Fresnel lens, for example. This arrangement may be suitable for use, for example, in automobile headlights. In FIG. 4B, light emitted by pcLEDs 100 is collected directly by projection lens 404 without use of intervening waveguides. This arrangement may be particularly suitable when LEDs or pcLEDs can be spaced sufficiently close to each other and may also be used in automobile headlights as well as in camera flash applications. A microLED display application may use similar optical arrangements to those depicted in FIGS. 4A-4B, for example.

In another example arrangement, a central block of LEDs or pcLEDs in an array may be associated with a single common (shared) optic, and edge LEDs or pcLEDs located in the array at the periphery of the central bloc are each associated with a corresponding individual optic.

Generally, any suitable arrangement of optical elements may be used in combination with the LED and pcLED arrays described herein, depending on the desired application.

LED and pcLED arrays as described herein may be useful for applications requiring or benefiting from fine-grained intensity, spatial, and temporal control of light distribution. These applications may include, but are not limited to, precise special patterning of emitted light from individual LEDs or pcLEDs or from groups (e.g., blocks) of LEDs or pcLEDs. Depending on the application, emitted light may be spectrally distinct, adaptive over time, and/or environmentally responsive. Such arrays may provide pre-programmed light distribution in various intensity, spatial, or temporal patterns. The emitted light may be based at least in part on received sensor data and may be used for optical wireless communications. Associated electronics and optics may be distinct at an individual LED/pcLED, group, or device level.

An array of independently operable LEDs or pcLEDs may be used in combination with a lens, lens system, or other optic or optical system (e.g., as described above) to provide illumination that is adaptable for a particular purpose. For example, in operation such an adaptive lighting system may provide illumination that varies by color and/or intensity across an illuminated scene or object and/or is aimed in a desired direction. Beam focus or steering of light emitted by the LED or pcLED array can be performed electronically by activating LEDs or pcLEDs in groups of varying size or in sequence, to permit dynamic adjustment of the beam shape and/or direction without moving optics or changing the focus of the lens in the lighting apparatus. A controller can be configured to receive data indicating locations and color characteristics of objects or persons in a scene and based on that information control LEDs or pcLEDs in an array to provide illumination adapted to the scene. Such data can be provided for example by an image sensor, or optical (e.g., laser scanning) or non-optical (e.g., millimeter radar) sensors. Such adaptive illumination is increasingly important for automotive (e.g, adaptive headlights), mobile device camera (e.g., adaptive flash), VR, and AR applications such as those described below.

Figure 5:
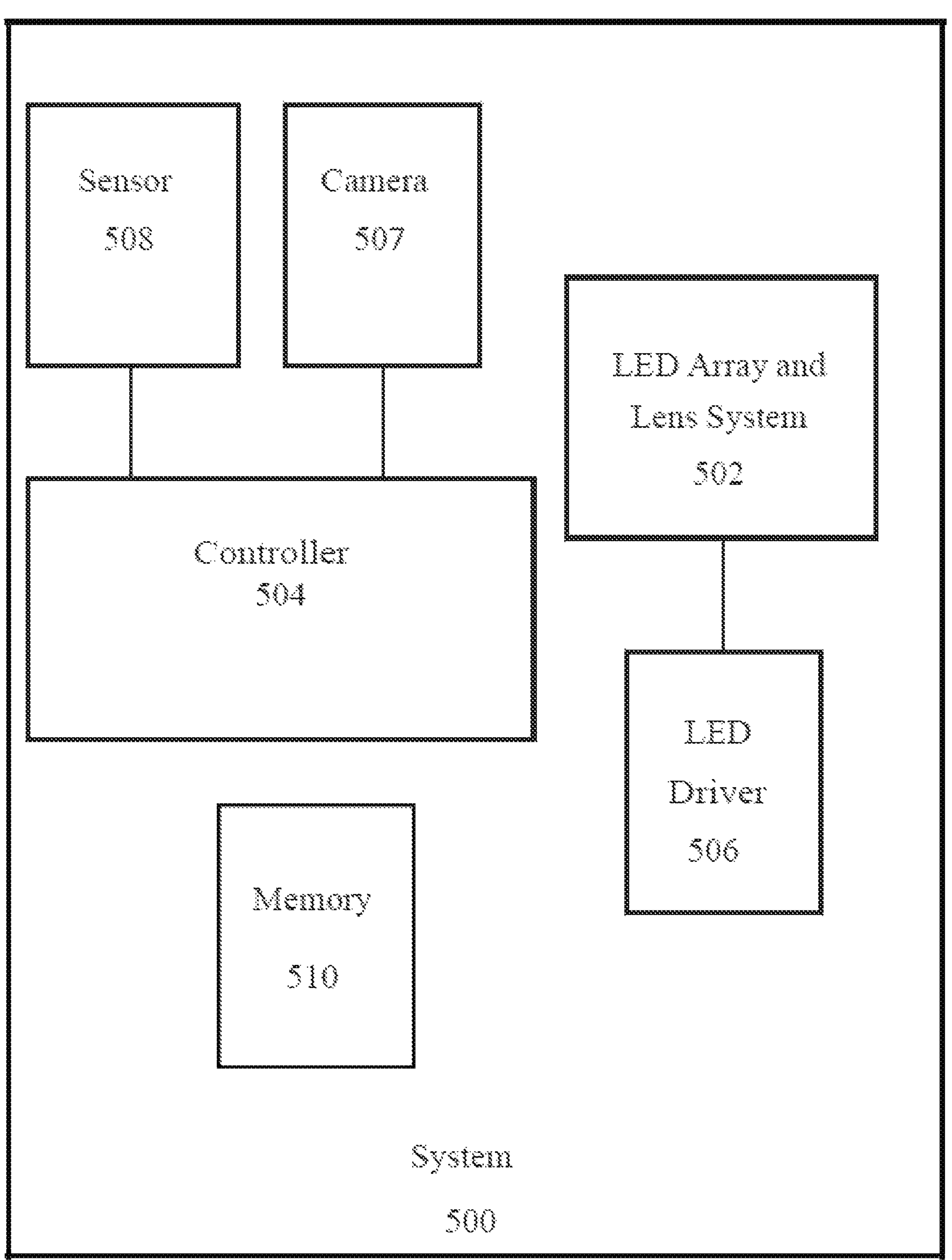
FIG. 5 schematically illustrates an example camera flash system.

FIG. 5 schematically illustrates an example camera flash system 500 comprising an LED or pcLED array and lens system 502, which may be or comprise an adaptive lighting system as described above in which LEDs or pcLEDs in the array may be individually operable. In operation of the camera flash system, illumination from some or all of the LEDs or pcLEDs in array and lens system 502 may be adjusted-deactivated, operated at full intensity, or operated at an intermediate intensity. The array may be a monolithic array, or comprise one or more monolithic arrays, as described above. The array may be a microLED array, as described above.

Flash system 500 also comprises an LED driver 506 that is controlled by a controller 504, such as a microprocessor. Controller 504 may also be coupled to a camera 507 and to sensors 508 and operate in accordance with instructions and profiles stored in memory 510. Camera 507 and LED or pcLED array and lens system 502 may be controlled by controller 504 to, for example, match the illumination provided by system 502 (i.e., the field of view of the illumination system) to the field of view of camera 507, or to otherwise adapt the illumination provided by system 502 to the scene viewed by the camera as described above. Sensors 508 may include, for example, positional sensors (e.g., a gyroscope and/or accelerometer) and/or other sensors that may be used to determine the position and orientation of system 500.

Figure 6:
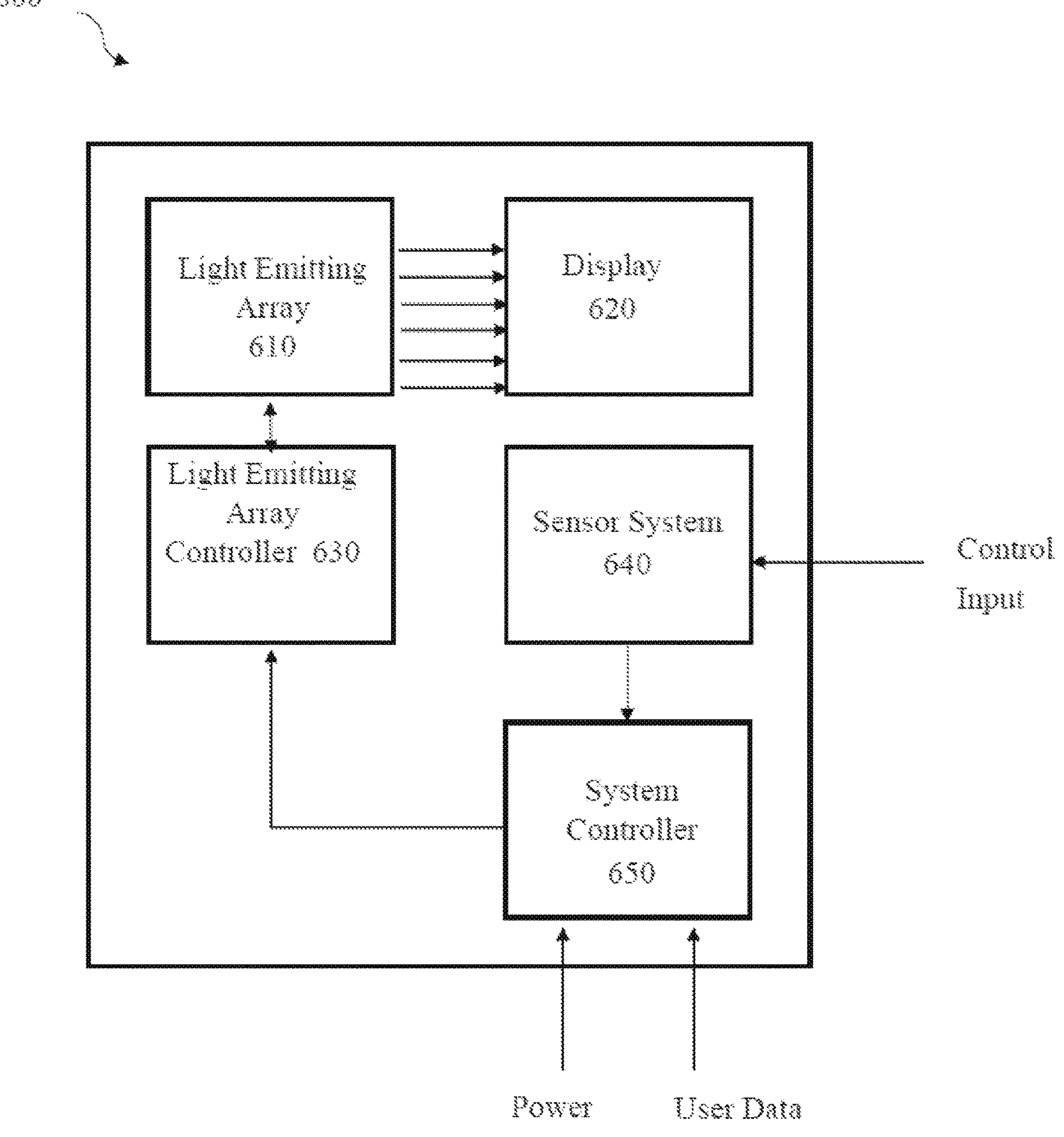
FIG. 6 schematically illustrates an example display (e.g., AR/VR/MR) system.

FIG. 6 schematically illustrates an example display (e.g., AR/VR/MR) system 600 that includes an array 610 of individually operable LEDs or pcLEDs, a display 620, a light emitting array controller 630, a sensor system 640, and a system controller 650. Array 610 may be a monolithic array, or comprise one or more monolithic arrays, as described above. The array may be monochromatic. Alternatively, the array may be a multicolor array in which different LEDs or pcLEDs in the array are configured to emit different colors of light, as described above. The array may therefore be or comprise a monolithic multicolor matrix of individually operable LED or pcLED light emitters, which may for example be microLEDs as described above. A single individually operable LED or pcLED or a group of adjacent such LEDs or pcLEDs in the array may correspond to a single pixel (picture element) in the display. For example, a group of three individually operable adjacent LEDs or pcLEDs comprising a red emitter, a blue emitter, and a green emitter may correspond to a single color-tunable pixel in the display. Array 610 can be used to project light in graphical or object patterns that can support AR/VR/MR systems Control input is provided to the sensor system 640, while power and user data input is provided to the system controller 650. In some embodiments modules included in system 600 can be compactly arranged in a single structure, or one or more elements can be separately mounted and connected via wireless or wired communication. For example, array 610, display 620, and sensor system 640 can be mounted on a headset or glasses, with the light emitting array controller and/or system controller 650 separately mounted.

System 600 can incorporate a wide range of optics (not shown) to couple light emitted by array 610 into display 620. Any suitable optics may be used for this purpose.

Sensor system 640 can include, for example, external sensors such as cameras, depth sensors, or audio sensors that monitor the environment, and internal sensors such as accelerometers or two or three axis gyroscopes that monitor an AR/VR/MR headset position. Other sensors can include but are not limited to air pressure, stress sensors, temperature sensors, or any other suitable sensors needed for local or remote environmental monitoring. In some embodiments, control input can include detected touch or taps, gestural input, or control based on headset or display position.

In response to data from sensor system 640, system controller 650 can send images or instructions to the light emitting array controller 630. Changes or modification to the images or instructions can also be made by user data input, or automated data input as needed. User data input can include but is not limited to that provided by audio instructions, haptic feedback, eye or pupil positioning, or connected keyboard, mouse, or game controller.

Devices as described above may include reflective side coatings on the light emitting elements. The reflective side coats optically isolate adjacent light emitting elements, thereby reducing cross-talk and increasing contrast between adjacent light emitting elements. As noted in the Background section, conventional deposition of such side coats may prevent the use of a wire bonding process by which the device may be connected to a power source, because the side coat is in the way.

Figure 7:
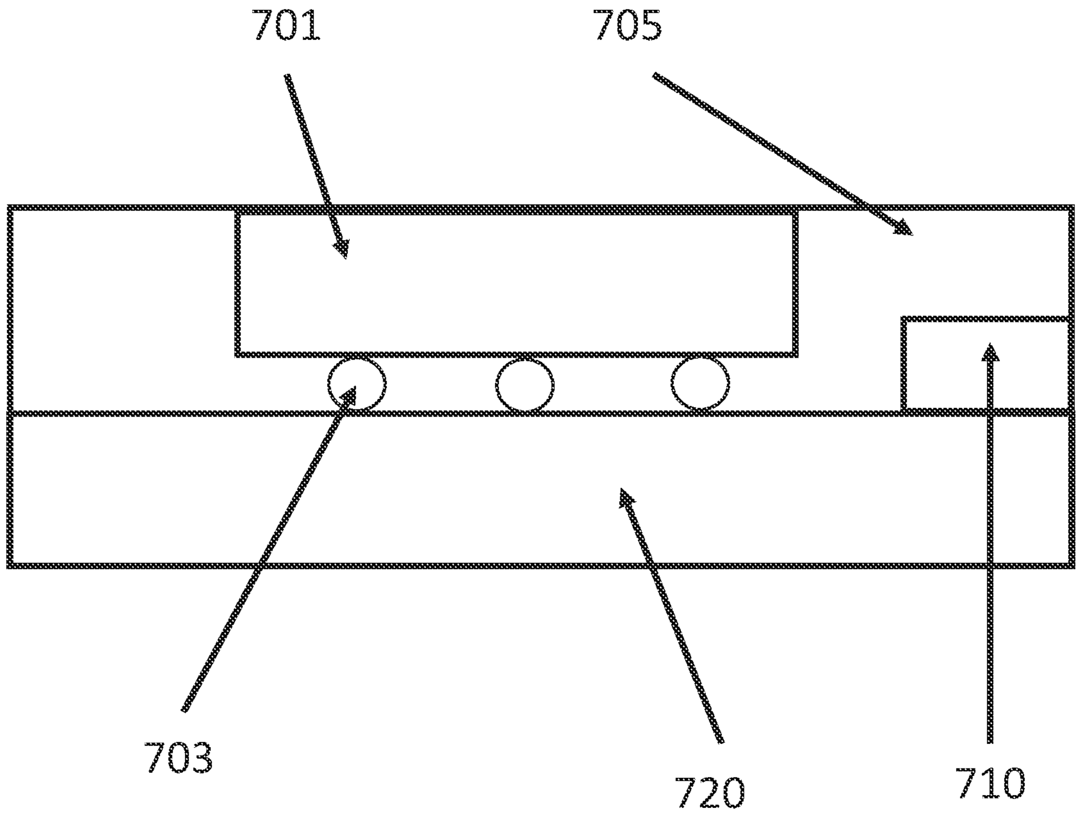
FIG. 7 shows a schematic cross-sectional view of an example light emitting device with an electrical contact made with a conventional process.

A conventional side coating process would cover electrical contacts that could otherwise be used for wire bonding of the package to a power source with the coat material. FIG. 7 illustrates a device made from a conventional process and having a die 701, bottom surface bumps 703, complementary metal-oxide-semiconductor (CMOS) wafer 720, electrical contact 710, and side coating material 705. The die 701 is attached to the CMOS wafer 720 via the bottom surface bumps 703. The die 701 may be a flip-chip structure comprising a semiconductor structure, such as an LED. The electrical contact 710 is physically spaced apart from the die 701. The die 701 may be electrically connected to the electrical contact 710 through the CMOS wafer 720. The side coating material 705 may be reflective. Because the side coating material 705 is disposed on the electrical contact 710, it prevents access to the electrical contact 710 so that wiring the electrical contact 710 to an external power source is difficult and may require further operations such as drilling through the side coating material 705 to make the electrical contact 710 accessible.

In order to overcome this problem, embodiments of this invention employ at least one bump disposed on top of the electrical contact in order to provide easy access for wire bonding to the electrical contact, since the bump is at or near the height of the top surface of the side coating material so that the side coating does not need to be drilled through to access the electrical contact.

Figure 8:
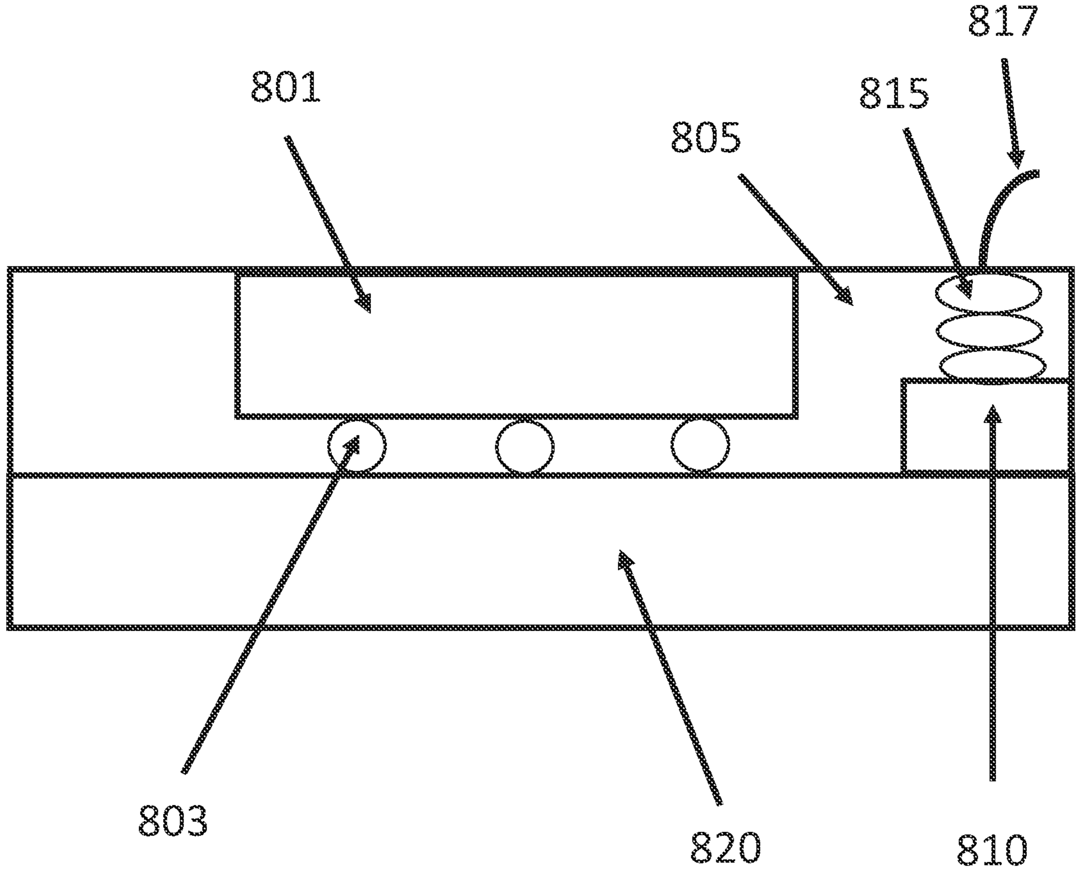
FIG. 8 shows a schematic cross-sectional view of an example semiconductor structure with bumps on an electrical contact of a light emitting device to reach substantially a same height as the light emitting surface of the light emitting device.

FIG. 8 illustrates an embodiment of the invention, with die 801, bottom surface bumps 803, substrate 820, at least one electrical contact 810, and side coating material 805. The substrate 820 may be a CMOS wafer 820. The die 801 may comprise a semiconductor LED, and may comprise a transparent substrate such as a patterned sapphire substrate. The die 801 may comprise pixels of different colors, such as LEDs emitting red, blue, or green light. FIG. 8 also illustrates a bump stack 815 and a wire 817. The bump stack 815 may comprise one or more electrical contact bumps disposed on the electrical contact, where the top surface of the topmost bump in the stack reaches and/or is flush with the top surface of the side coating material 805. The thickness of bump stack 815 (that is, the vertical distance from the top surface of electrical contact 810 upon which the bump stack 815 is disposed to the top of bump stack 815) may be from 30 μm to 300 μm. Bump stack 815 may have a height equal to or taller than the die 801. When the bump stack 815 is taller than the die 801, this means that the top of bump stack 815 disposed on the electrical contact 810 is higher than the top surface of die 801 in the vertical direction, the vertical direction being perpendicular to a plane of the CMOS wafer 820. That is, height in this context means the relative vertical distance of the top surface of the element in relation to the CMOS wafer 820 upon which the element is disposed. The bumps in the bump stack may consist of or comprise gold. The bumps in the bump stack may consist of or comprise copper. If the bumps in the bump stack consist of or comprise copper, the topmost bump may also comprise a layer of gold on its top surface that is flush with or substantially flush with the top surface of the side coating material 805. Furthermore, the top surface of the side coating material 805 may be flush with or substantially flush with the top surface of the die 801, i.e., the light emitting surface of the die 801. The light emitting surface of the die 801 may be the top surface of a transparent substrate disposed above an LED, or it may be the top surface of an LED if there is no transparent substrate included in the die 801. Accordingly, the light emitting surface of the die 801 may be flush with or substantially flush with the top surface of the topmost bump in bump stack 815. That is, the top surface of the die 801, the top surface of the side coating material 805, and the top surface of the topmost bump in bump stack 815 may substantially form a single plane. A wire 817 is electrically and/or physically connected to the bump stack 815 through the top surface of the bump stack. It may be connected to an external power source that, through the bump stack 815, powers the die 801.

Figure 9:
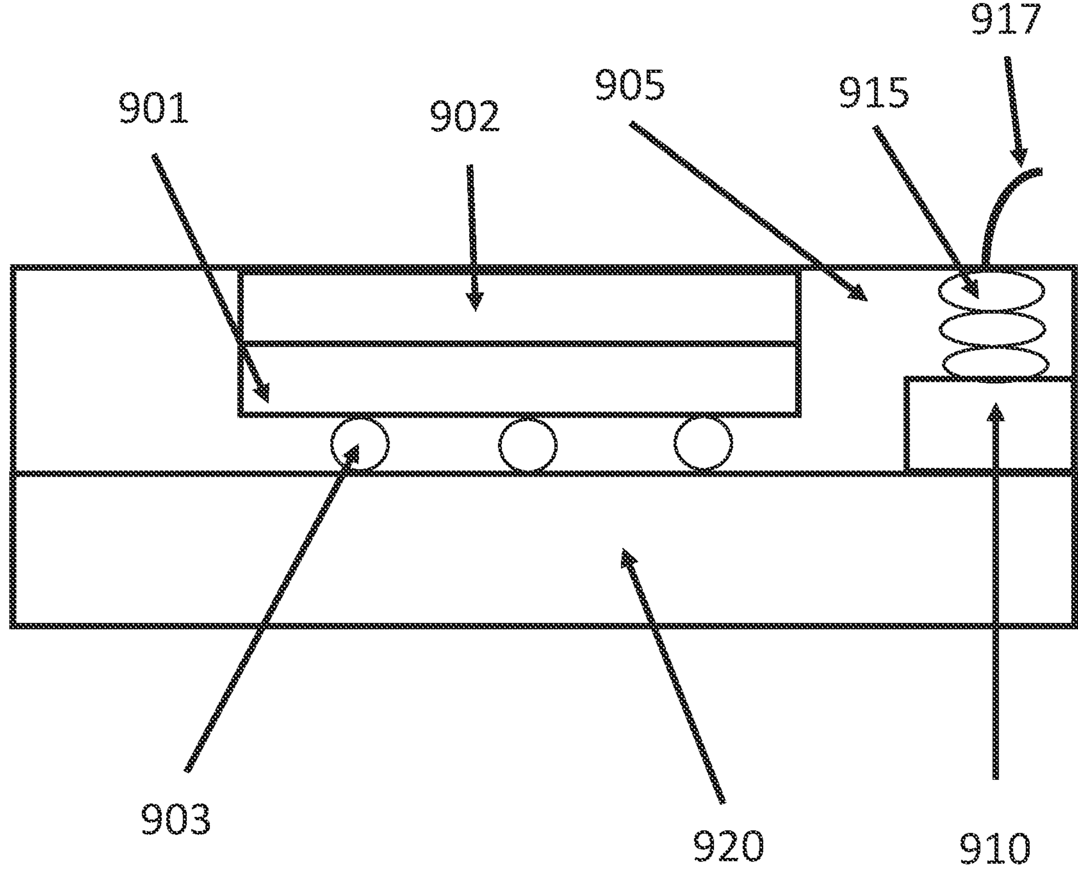
FIG. 9 shows a schematic cross-sectional view of an example light emitting device having a phosphor layer and having bumps to reach substantially a same height as the light emitting surface of the light emitting device.

FIG. 9 illustrates an embodiment of this invention, with die 901, bottom surface bumps 903, CMOS wafer 920, electrical contact 910, side coating material 905, bump stack 915, and wire 817. FIG. 9 also illustrates a phosphor layer 902 disposed on the die 901. The die 901 and the phosphor 902 may each be segmented, with trenches between segments filled with side coating material 905. Here, the top surface of phosphor layer 902 (i.e., the light emitting surface of, collectively, die 901 and phosphor layer 902) may be flush with or substantially flush with the top surface of side coating material 905 (e.g., adjacent to the bump stack 915 and the phosphor layer 902) and the top surface of topmost bump in bump stack 915. That is, the top surface of the phosphor layer 902, the top surface of the side coating material 905, and the top surface of the topmost bump in bump stack 915 substantially form a single plane. Alternatively, a remaining sacrificial layer may be present on the phosphor layer 902 to serve as the light emitting surface of, collectively, die 901, phosphor layer 902 and the remaining sacrificial layer. The remaining sacrificial layer may result from the process of forming the device in FIG. 9, as explained in FIGS. 13A-13C and further described below. In this case, the top surface of the remaining sacrificial layer is flush with the top surface of the topmost bump in bump stack 915 and the top surface of the side coating material 905. A wire 917 is electrically and/or physically connected to the bump stack 915 through the top surface of the bump stack. It may be connected to an external power source that, through the bump stack 915, powers the die 901.

The top surface of die 901 may be lower than the top surface of the side coating material 905, the top surface of topmost bump in bump stack 915, and the top surface of phosphor layer 902. The top surface of die 901 may be higher than the top surface of electrical contact 910.

The elements mentioned in FIGS. 7-9 described above may be further clarified, augmented, and/or substituted by descriptions of the corresponding elements described below.

Figure 10:
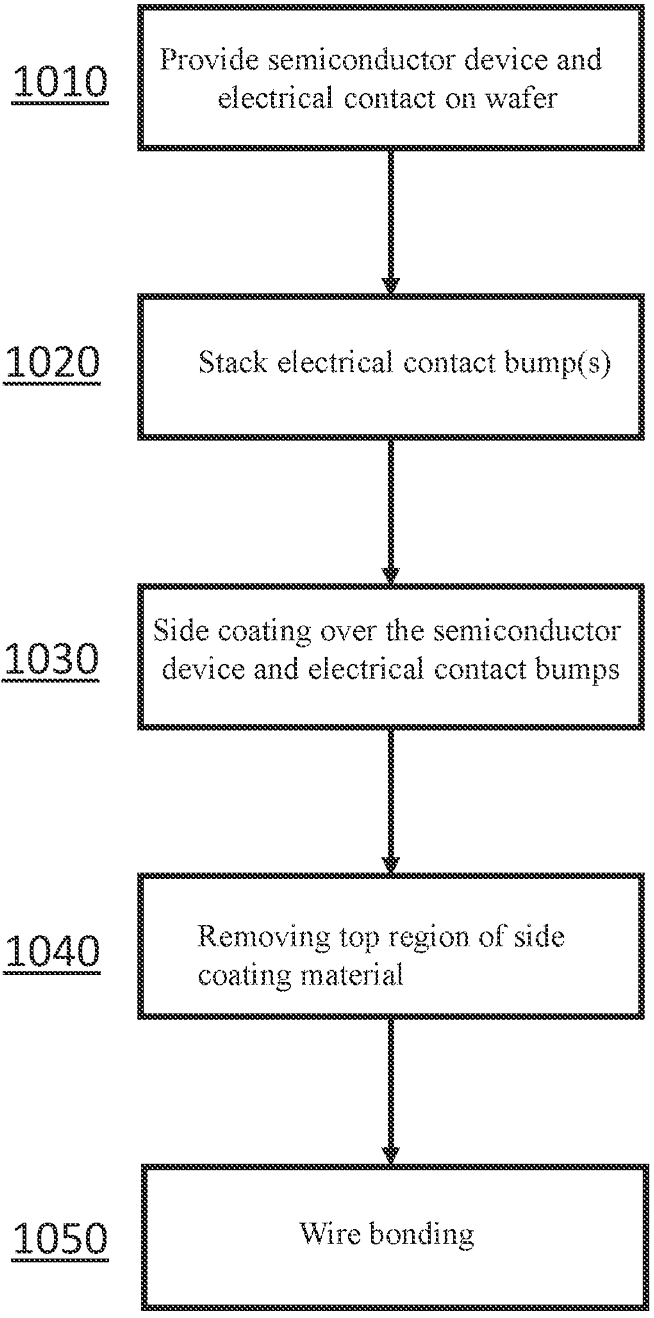
FIG. 10 shows a flow process of an example method of placing at least one bump on an electrical contact of a light emitting device to reach substantially a same height as the light emitting surface of the light emitting device.

FIG. 10 illustrates embodiments of this invention in the form of a general process.

At 1010, A light emitting device and electrical contact is provided on a wafer. The light emitting device may comprise a die and/or phosphor layer as described above, and the wafer may be a CMOS wafer as described above. The electrical contact may be spaced apart from the die and be electrically connected to it through the CMOS wafer.

At 1020, at least one electrical contact bump is disposed/stacked on the electrical contact. Although the process flow here shows the electrical contact bump being disposed on the electrical contact after the light emitting device is attached to the wafer, the electrical contact bump may also be disposed before the light emitting device is attached to the wafer. The electrical contact bump may be or comprise of gold and/or copper.

At 1030, side coating is disposed to cover the light emitting device and the electrical contact bumps. The side coating material may be reflective material, or it may be non-reflective.

At 1040, at least some of the side coat material is removed, particularly a top region of the side coating material. The removal may be done by blasting (e.g., bead blasting), planarization, and/or grinding, depending on the hardness of the molding material. The removal may level the side coating material such that it is flush with the electrical contact bumps and the top surface of the light emitting device. In removing the top region of the side coating material, a portion of the light emitting device may also be removed, such as a carrier substrate or sacrificial layer; however, such removal is not necessary.

At 1050, wire bonding is done to the electrical contact bumps, which are now exposed and accessible due to the removal of the molding. Wire bonding electrically connects an external power source to the semiconductor device through the electrical contact bump stack and electrical contact.

Further embodiments and/or details of this process are specified below.

Figure 11:
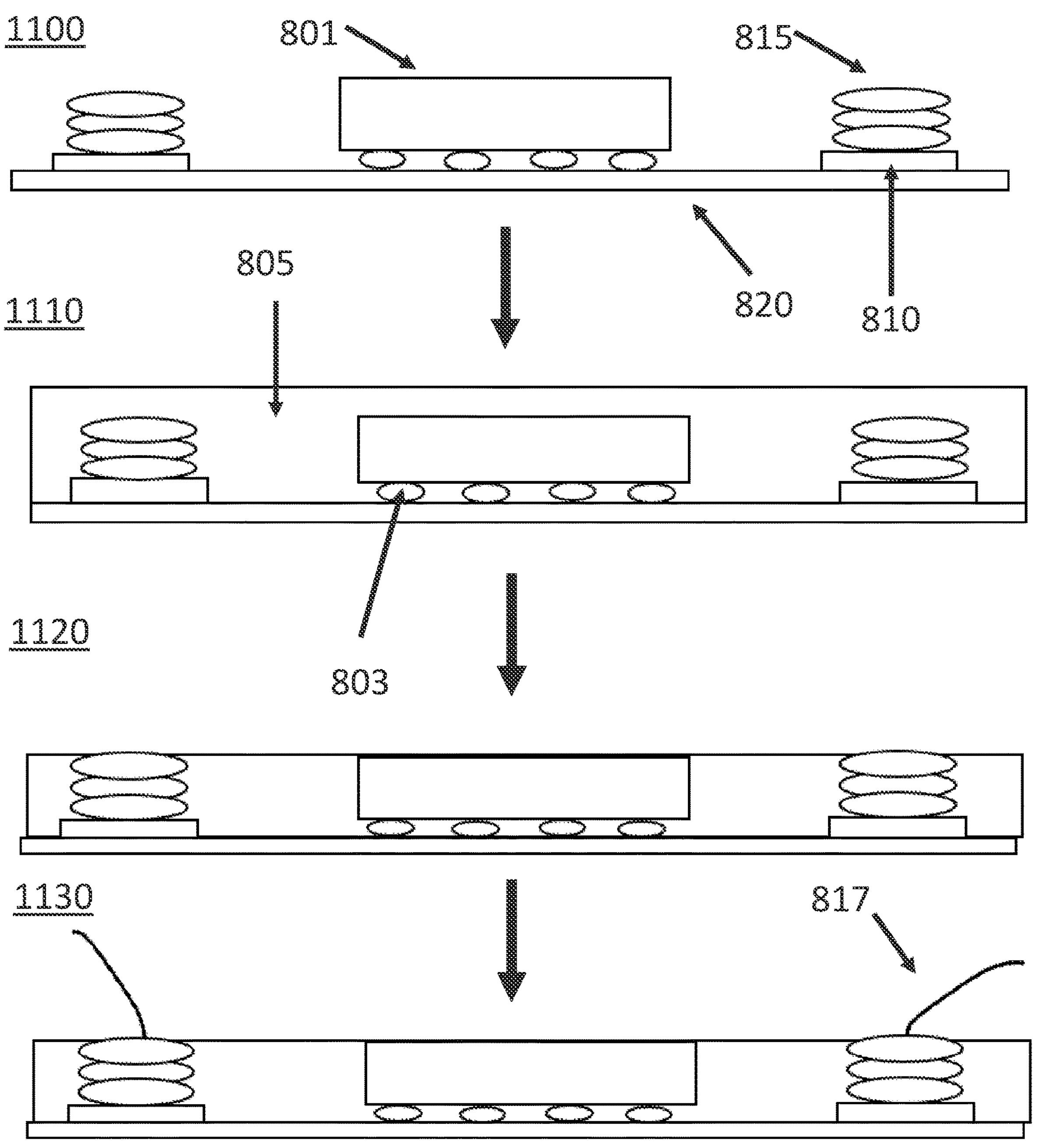
FIG. 11 shows a flow process of an example method of placing at least one bump on an electrical contact of a light emitting device to reach substantially a same height as the light emitting surface of the light emitting device.

FIG. 11 illustrates embodiments of this invention in the form of a process.

At 1100, a die 801 is attached to a complementary metal-oxide-semiconductor (CMOS) wafer. The die 801 may be monolithic, and attached to the CMOS wafer 820 through bottom surface bumps 803 on a bottom surface of the die 801. The die 801 may comprise a substrate and a semiconductor structure attached to the substrate. The substrate may be a hard substrate, such as a sapphire substrate. The substrate may be disposed above the semiconductor structure. Alternatively, the die 801 may comprise only the semiconductor structure without a substrate. At least one electrical contact 810 may also be attached to the CMOS wafer 820. In an embodiment, the electrical contact 810 is spaced off to the side of the die 801 so that it is not in direct physical contact with the die 801. The die 801 and electrical contact 810 may be electrically connected through the CMOS wafer 820 and the bottom surface bumps 803. FIG. 10 illustrates two electrical contacts 810 spaced on opposing sides of the die. However, there may only be one electrical contact.

At least one electrical contact bump is attached to top surface of the electrical contact 810 to form a bump stack 815. At least one bump may be attached to each electrical contact. More than one bump may be attached to each electrical contact, such as between two to ten bumps, such as between three to five bumps. In FIG. 11, three bumps are stacked on top of each other for each electrical contact. The shape of the bump, once attached to the electrical contact, may be ovular, pancake, spherical, and/or coin shaped, although the shape is not so limited. When multiple bumps are stacked on one another for each electrical contact, they may be stacked so that imaginary vertical lines perpendicular to the plane of the CMOS wafer running through the center each bump are aligned or substantially aligned with those of each other bump on that electrical contact. The bumps in the bump stack may consist of or comprise gold. The bumps may consist of or comprise copper. If the bumps comprise copper, the top surface of the bump stack 815 may comprise a layer of gold flush with the top surface of the side coating material 805 and the light emitting surface of the die 801.

At 1110, side coating 805 is disposed the CMOS wafer 820, the electrical contact 810 and the bump stack 815. The side coating 805 may be disposed by molding, e.g., compression molding. The side coating 805 also covers and underfills the die 801 and surrounds the bumps 803 under the die 801.

At 1120, at least some of the side coating 805 is removed. The removal may be done by blasting, and the blasting may be micro-bead blasting. The blasting levels and lowers the top surface of the side coating. The blasting may lower the top surface of the side coating 805 to be flush with the top surface of the die 801, i.e., the light emitting surface of the die. The blasting may lower the top surface of the side coating 805 to be flush with the top surface of the topmost contact bump of bump stack 815. Alternatively, the blasting may lower the top surface of the side coating 805 below the top surfaces of the topmost contact bump and/or the top surface of the die 805. In this way, the contact bump of bump stack 815 may be easily accessible for wire bonding, enabling connection of the die through the contact bump to a power source.

Additionally, the blasting may blast away some or all of the substrate of the die 801 if such a substrate is included in die 801. If the substrate is a hard material, a method like planarization may not be sufficient to satisfactorily remove the hard substrate. Blasting, on the other hand, may satisfactorily remove the hard substrate. If all of the substrate is removed by blasting, the semiconductor structure of the die is exposed as desired.

Figure 12:
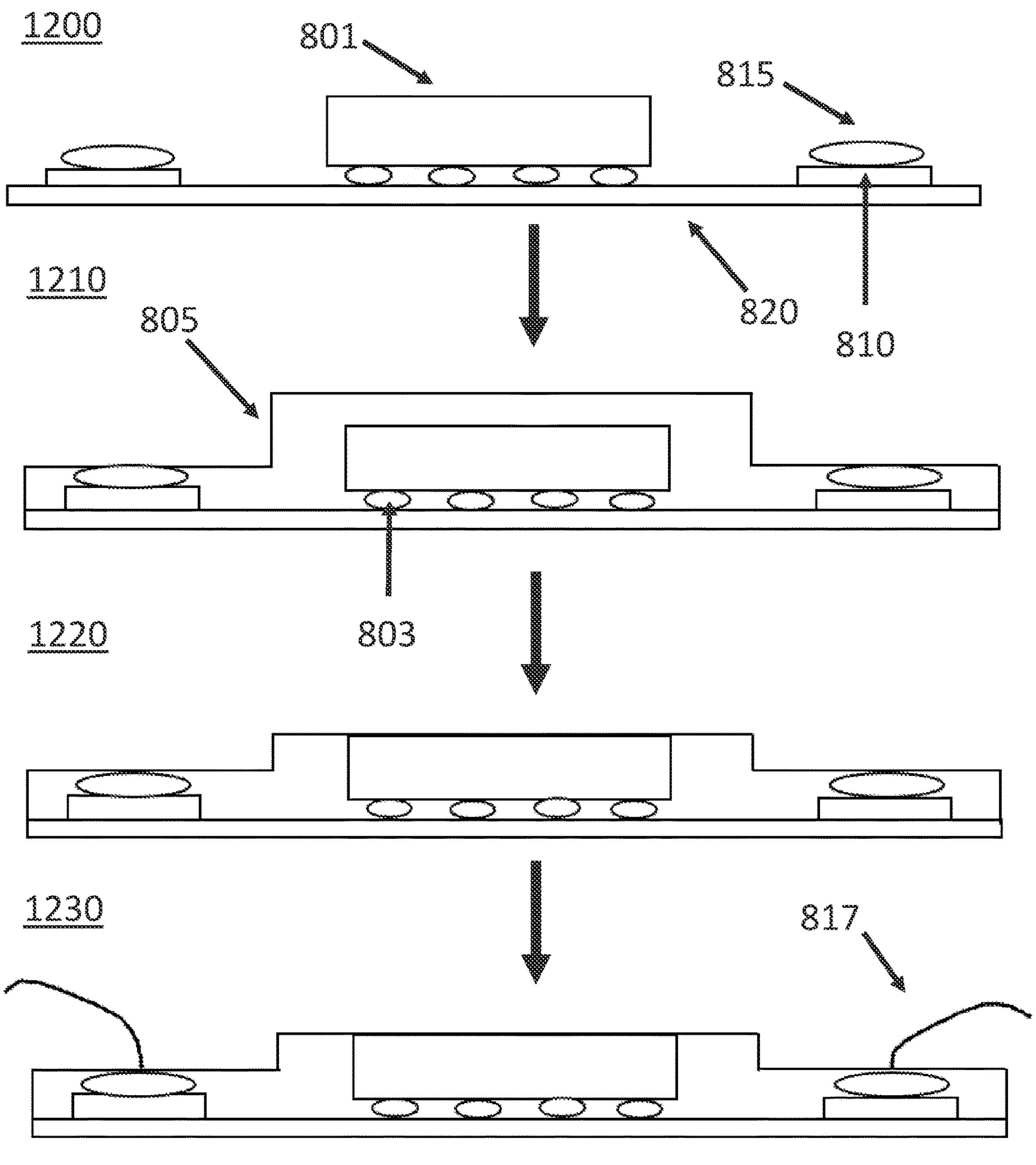
FIG. 12 shows a flow process of an example method of placing at least one bump on an electrical contact of a light emitting device to reach substantially a same height as a top surface of side coating material disposed around the bump of the light emitting device.

FIG. 12 illustrates embodiments of this invention in the form of a process.

The process shown in FIG. 12 is similar to that shown in FIG. 11 with a few differences. In FIG. 12 only one bump 815 is disposed on each of the electrical contacts 810. At 1210, when the side coating material 805 is disposed on the die 801 and the bump 815, the side coating material 805 is disposed on two different levels rather than just one level.

For example, the region of side coating material 805 disposed directly over the die 801 and the region disposed adjacent to the die 801 have a higher height of a top surface, compared to the height of the region of side coating material 805 disposed over the bumps 815 and the region disposed adjacent to the bumps 815. The side coating material 805 may be disposed using a mold shape matching the two leveled shape as shown in 1210. At 1210, a thickness of the side coating material 805 measured from a top surface of the die 801 to the top surface of the side coating material 805 above the die 801 is the same thickness of the side coating material measured from a top surface of the bump 815 to a top surface of the side coating material 805 above the bump 815. This same thickness of the side coating material 805 above both the die 801 and the bump 815 ensures that when uniform blasting is done in 1220, both the top surface of the die 801 and the top surface of the bumps 815 are exposed by uniform blasting without requiring any masks or other processes. That is, blasting removes the same thickness of side coating material 805 above the die 801 as it does above the bump 815. The top surface of the die 801 and the bump 815 are simultaneously exposed by this process. Subsequently, wire bonding is done at 1230 using wires 817 connected to the exposed top surfaces of bump 815. In other words, the wire bond 817 is directly physically connected to the bump 815 and the bump 815 is directly physically connected to the electrical contact 810.

Figure 13A:
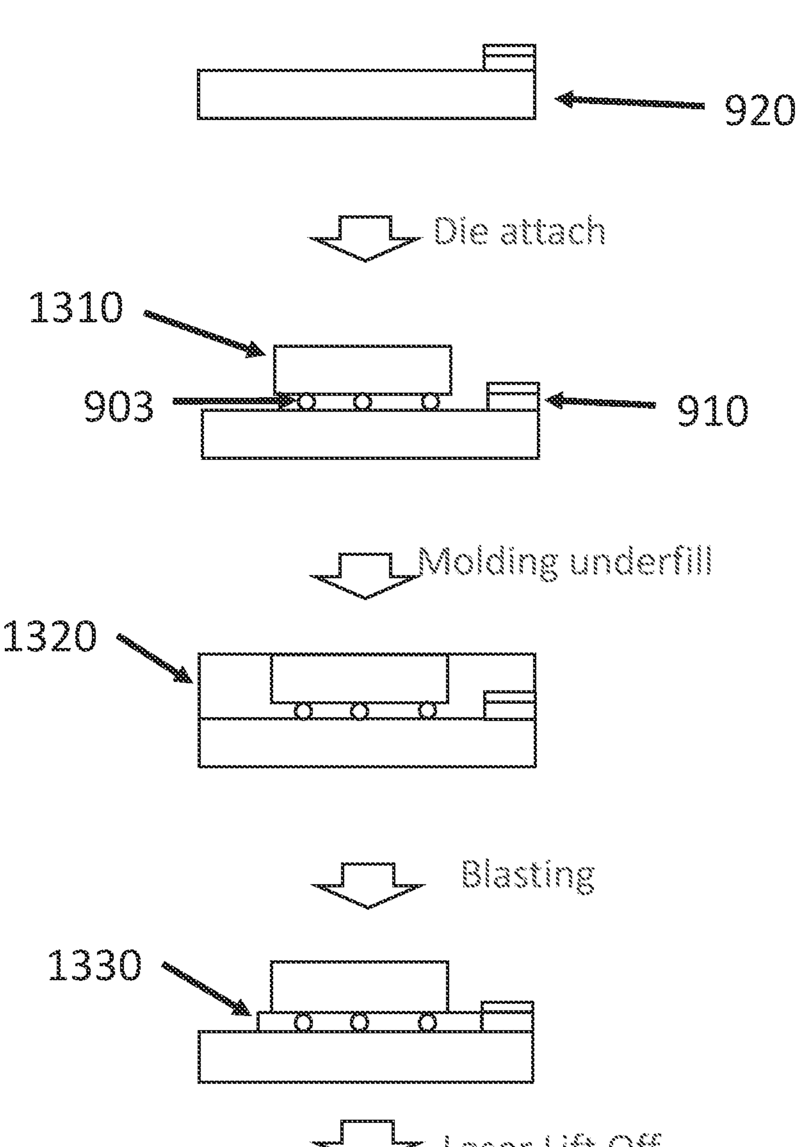
FIGS. 13A, 13B, and 13C shows a continuous and linked flow process of an example method of placing at least one bump on an electrical contact of a light emitting device to reach substantially a same height as the light emitting surface of the light emitting device.
Figure 13B:
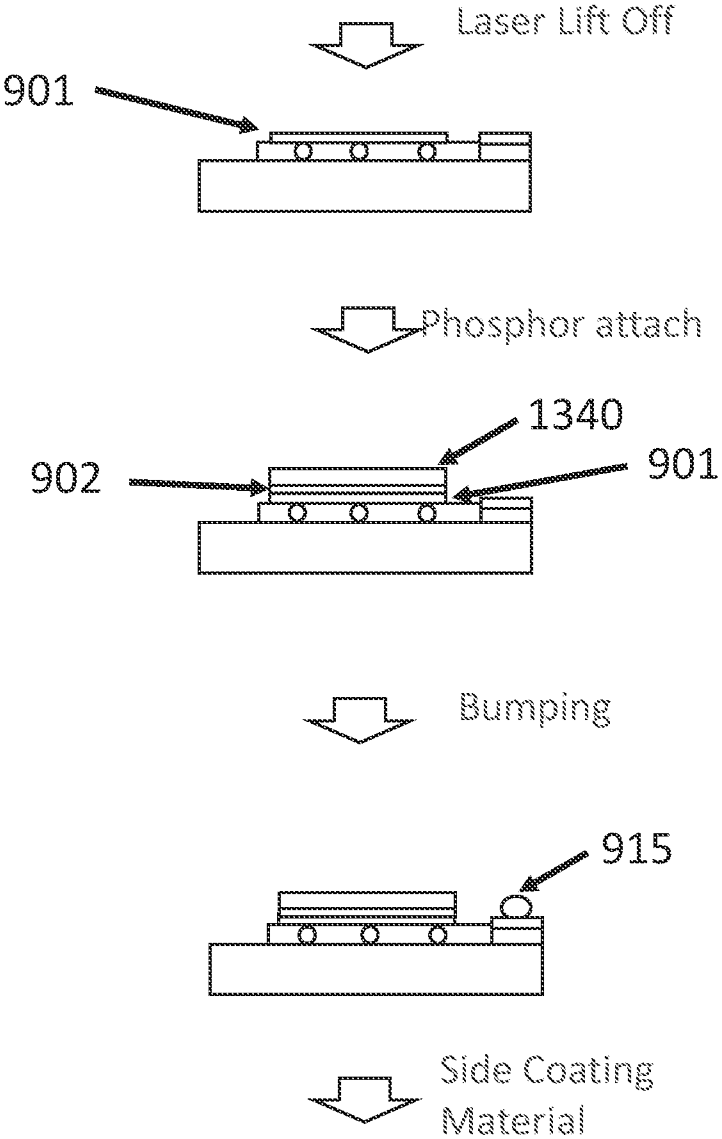
Figure 13C:
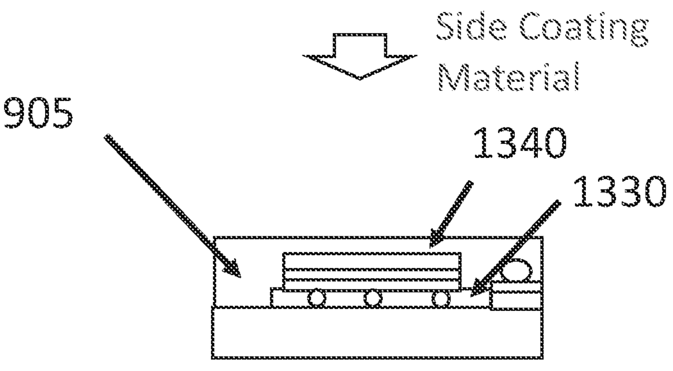
Figure 13C:
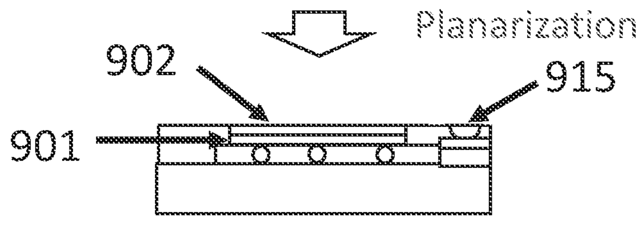
Figure 13C:
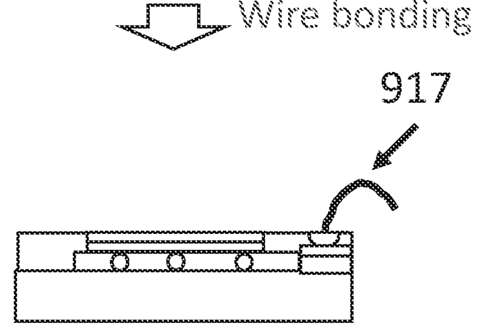

FIGS. 13A, 13B, and 13C illustrates embodiments of the invention in the form of a process, with all three figures forming a continuous and linked process.

As shown in FIG. 13A, a die 1310 is attached to a CMOS wafer 920. The die 1310 may be monolithic, and attached to the CMOS wafer 920 through bottom surface bumps 903 on a bottom surface of the die 1310. The die 1310 may comprise a transparent substrate and a semiconductor structure attached to the transparent substrate. The semiconductor structure may be or comprise a thin-film LED and/or an epitaxial layer. At least one electrical contact 910 may also be attached to the CMOS wafer 920. In an embodiment, the electrical contact 910 is spaced off to the side of the die 1310 so that it is not in direct physical contact with the die 1310. The die 1310 and electrical contact 910 may be electrically connected through the CMOS wafer 920 and the bottom surface bumps 903. FIG. 13A illustrates one electrical contact 910 spaced apart from the die 1310, although there may be more than one electrical contact 910 on the CMOS wafer 920. Likewise, there may be more than one die 1310 disposed on the CMOS wafer 920.

Molding is done to cover the CMOS wafer and the electrical contact. The molding 1320 also covers and underfills the die and surrounds the bumps under the die. The molding 1320 may not be reflective material, or it may be reflective material.

After the die 1310 is underfilled, the molding 1320 is blasted to expose the sidewalls of the die 1310, and at least a portion of the sidewalls and top surface of the electrical contact. This blasting exposes the substrate of the die for the laser lifting off process. An underfill 1330 is leftover from the molding 1320, and supports the die 1310. The electrical contact 910 may be in direct physical contact with the molding underfill 1330.

Laser lift off completely or partially removes the transparent substrate of the die 1310, as shown in FIG. 13B (continued from FIG. 13A). The remaining die 901 may comprise or consist of a semiconductor diode structure, e.g., a thin film LED and/or epitaxial layer, disposed on the remaining molding underfill 1330. The underfill 1330 mechanically supports this remaining die 910, which may be very thin, for example of 5-10 microns thickness, so as to require this support.

A converter material, i.e., a phosphor layer 902, is attached to a top surface of the thin film LED. The phosphor layer 902 may be monolithic. A sacrificial layer 1340 is also deposited on a top surface of the phosphor layer 902. The phosphor layer 902 and sacrificial layer 1340 may be deposited simultaneously, or the phosphor layer 902 may be deposited before the sacrificial layer 1340\.

Subsequently, the monolithic die 901 and phosphor layer 902 may be segmented. The die 901 and phosphor layer 902 may then comprise segments of electrically isolated and/or independently operable sub-dies with trenches in between them. After segmentation, the phosphor layer 902 is then a phosphor array corresponding to the sub-dies of the die 901 upon which it is disposed. For example, the die may be a 7×7 array and the phosphor layer may also be a 7×7 array. The die and phosphor layer may each be anywhere from a 3×3 to 9×9 array, and/or anywhere a 3×3 to 5×5 array. The sidewalls of the die and the sidewalls of the phosphors may be vertically aligned with each other so that they are flush with each other to form the trenches in between the segments. The trenches may be anywhere from 10-30 microns, for example from 20-25 microns thick.

At least one electrical contact bump 915 may be attached to each electrical contact 910. More than one bump may be attached to each electrical contact, such as between two to ten bumps, such as between three to five bumps. In FIG. 11, one contact bump 915 is disposed on the electrical contact 910. The shape of the bump 915, once attached to the electrical contact 910, may be ovular, pancake, spherical, and/or coin shaped, although the shape is not so limited. When multiple bumps are stacked on one another for each electrical contact, they may be stacked so that imaginary vertical lines perpendicular to the plane of the CMOS wafer running through the center each bump are aligned or substantially aligned with those of each other bump on that electrical contact. The bump may consist of or comprise gold. The bump may consist of or comprise copper. If the bump comprises copper, the copper bumps may be deposited on the electrical contact first, and then a thin layer of gold may be disposed on top of the copper bump stack. The bumps may be stacked to be below the top surface of the sacrificial layer, or may be stacked so the top surface of the topmost bump flush with the top surface of the sacrificial layer.

As shown in FIG. 13C continuing on from FIG. 13B, side coating material 905 is disposed around and/or on top of the die 901 and the phosphor layer 902. Reflective material is also disposed around and/or on top of the electrical contact and bump. If the die and phosphor layer are segmented, the reflective material fills the trenches between the segments. The reflective material in the trenches may prevent at least some crosstalk between the segmented pixels of the die. The reflective material may be liquid silicone molding.

Subsequently, at least some of the side coating material 905 is removed. The removal may be by planarization, and the planarization may be or comprise polishing and/or chemical etching. The planarization removes at least some of the sacrificial layer and smooths the now exposed surface of the phosphor layer, as well as removing some of the top portion of the reflective material to be flush with the planarized surface of the phosphor layer. Some of the sacrificial layer may remain above the phosphor layer, where a top surface of this remaining sacrificial layer is considered the light emitting surface of the device, such that light coming from the die 901 and the phosphor 902 emitted upwards (away from the CMOS wafer 920) is emitted through the remaining sacrificial layer. Alternatively, all of the sacrificial layer is removed such that the top surface of phosphor 902 is considered the light emitting surface for the light emitting device. In removing some of the side coating material, the surface of the side coating material is lowered to be level, substantially level, or lower than the top surface of the topmost electrical contact bump. The top surface of the topmost bump may also be simultaneously planarized by this process, so that its previously round top surface may become a flat plane flush with the top surface of side coating material 905. This process makes the electrical contact bump 915 accessible, which enables wiring from a power source to be electrically and/or physically connected to the bump. Once wire bonding is done, the die can be successfully powered.

This disclosure is illustrative and not limiting. Further modifications will be apparent to one skilled in the art in light of this disclosure and are intended to fall within the scope of the appended claims.

What is claimed is:

1. A light emitting device, comprising:
- a substrate;
- a semiconductor light emitting structure disposed on and vertically above the substrate, the semiconductor light emitting structure having a light emitting surface, a bottom surface opposite the light emitting surface and facing the substrate, and sidewalls connecting the light emitting surface and the bottom surface;
- side coating material disposed on the substrate and against the sidewalls of the semiconductor light emitting structure, the side coating material having a first top surface;
- an electrical contact disposed in direct contact with the substrate and electrically connected to the semiconductor light emitting structure; and
- at least one bump disposed on the electrical contact, comprising at least one metal, and horizontally spaced apart from the semiconductor light emitting structure with the side coating material between the at least one bump and the semiconductor light emitting structure, a top surface of the at least one bump substantially flush with the first top surface of the side coating material,
- wherein the first top surface of the side coating material does not vertically overlap the semiconductor light emitting structure.

2. The light emitting device of claim 1, wherein the semiconductor light emitting structure comprises an epitaxial layer and a transparent substrate disposed above the epitaxial layer, and a top surface of the transparent substrate is the light emitting surface of the semiconductor light emitting structure, and
- the light emitting surface of the semiconductor light emitting structure is flush with the top surface of the at least one bump.

3. A mobile device comprising:
- a camera;
- a flash illumination system comprising the light emitting device of claim 1 and a plurality of LEDs disposed on the substrate, the semiconductor light emitting structure and the plurality of LEDs arranged in an array; and
- a controller configured to operate the array.

4. An illumination device comprising:
- the light emitting device of claim 1; and
- an optical element arranged in an optical path of the semiconductor light emitting structure.

5. The light emitting device of claim 1, wherein the at least one bump comprises three or more bumps.

6. The light emitting device of claim 5, wherein the at least one metal is gold or copper.

7. The light emitting device of claim 1, wherein the at least one metal comprises gold and copper.

8. The light emitting device of claim 1, wherein each of the at least one bump is shaped to be ovular or spherical.

9. The light emitting device of claim 1, further comprising a sacrificial layer disposed on the semiconductor light emitting structure that comprises a sacrificial layer top surface flush with the top surface of the at least one bump.

10. The light emitting device of claim 1, further comprising a phosphor layer disposed on the semiconductor light emitting structure that comprise a phosphor top surface flush with the top surface of the at least one bump.

11. The light emitting device of claim 1, wherein the semiconductor light emitting structure is segmented.

12. The light emitting device of claim 1, further comprising a phosphor layer disposed on the semiconductor light emitting structure, the phosphor layer being segmented.

13. The light emitting device of claim 1, further comprising a wire in direct contact with the top surface of the at least one bump.

14. The light emitting device of claim 1, wherein the side coating material is reflective.

15. The light emitting device of claim 1, wherein the side coating material is non-reflective.

16. The light emitting device of claim 1, wherein the top surface of the at least one bump is not flush with the light emitting surface of the semiconductor light emitting structure.

17. The light emitting device of claim 16, wherein the light emitting surface is at a higher height than the top surface of the at least one bump.

18. The light emitting device of claim 1, wherein the side coating material comprises a side coating top surface with two levels at different heights from each other.

19. The light emitting device of claim 1, further comprising a bump stack disposed on an opposite side of the semiconductor light emitting structure as the at least one bump.

20. The light emitting device of claim 1, further comprising a sapphire substrate attached to the semiconductor light emitting structure.

* * * * *